(12) United States Patent
Yang

(10) Patent No.: US 11,449,418 B2
(45) Date of Patent: Sep. 20, 2022

(54) CONTROLLER AND METHOD FOR SELECTING VICTIM BLOCK FOR WEAR LEVELING OPERATION

(71) Applicant: SK hynix Inc., Gyeonggi-do (KR)

(72) Inventor: Seung Won Yang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 92 days.

(21) Appl. No.: 17/002,243

(22) Filed: Aug. 25, 2020

(65) Prior Publication Data

US 2021/0216446 A1 Jul. 15, 2021

(30) Foreign Application Priority Data

Jan. 9, 2020 (KR) .................. 10-2020-0002903

(51) Int. Cl.
*G06F 12/02* (2006.01)
*G06F 12/0882* (2016.01)
*G06F 11/07* (2006.01)
*G11C 16/34* (2006.01)
*G11C 16/16* (2006.01)

(52) U.S. Cl.
CPC ........ *G06F 12/0246* (2013.01); *G06F 11/076* (2013.01); *G06F 12/0882* (2013.01); *G11C 16/16* (2013.01); *G11C 16/3495* (2013.01); *G06F 2212/7201* (2013.01); *G06F 2212/7211* (2013.01)

(58) Field of Classification Search
CPC ............... G06F 12/0246; G06F 11/076; G06F 12/0882; G06F 2212/7201; G06F 2212/7211; G11C 16/16; G11C 16/3495
USPC ......................................................... 711/154
See application file for complete search history.

(56) References Cited

U.S. PATENT DOCUMENTS

2018/0157586 A1* 6/2018 Yl ...................... G06F 12/0246
2019/0179741 A1* 6/2019 Liu ....................... G06F 3/0679

FOREIGN PATENT DOCUMENTS

| KR | 10-2014-0033099 | 3/2014 |
| KR | 10-2018-0003692 | 1/2018 |
| KR | 10-2018-0065075 | 6/2018 |

* cited by examiner

*Primary Examiner* — Hua J Song
(74) *Attorney, Agent, or Firm* — IP & T Group LLP

(57) ABSTRACT

A method for operating a controller for controlling a memory device including memory blocks, the method includes: determining candidate blocks based on erase counts of the memory blocks; determining a victim block among the candidate blocks based on data update counts of logical addresses associated with a plurality of pages in each of the candidate blocks; and moving data of the victim block into a destination block.

18 Claims, 5 Drawing Sheets

FIG. 3

TABLE1

| LBA | UPDATE COUNT | FLAG |
|---|---|---|
| 1 | 2 | 0 |
| 2 | 9 | 0 |
| 3 | 3 | 0 |
| 4 | 9 | 0 |
| ... | ... | ... |

↑ 1 WRITE LBA2 CMD
2 READ CMDs

TABLE2

| LBA | UPDATE COUNT | FLAG |
|---|---|---|
| 1 | 2 | 0 |
| 2 | 10 | 1 |
| 3 | 3 | 0 |
| 4 | 9 | 0 |
| ... | ... | ... |

↑ 2 WRITE LBA4 CMDs

TABLE3

| LBA | UPDATE COUNT | FLAG |
|---|---|---|
| 1 | 1 | 0 |
| 2 | 9 | 1 |
| 3 | 2 | 0 |
| 4 | 10 | 1 |
| ... | ... | ... |

↑ 5 READ CMDs

TABLE4 (144)

| LBA | UPDATE COUNT | FLAG |
|---|---|---|
| 1 | 0 | 0 |
| 2 | 8 | 0 |
| 3 | 1 | 0 |
| 4 | 9 | 1 |
| ... | ... | ... |

FIG. 5

| BLOCK | ERASE COUNT | HOT PAGE COUNT | |
|---|---|---|---|
| 1 | 15 | 50 | |
| 2 | 12 | 22 | → VICTIM BLOCK |
| 3 | 12 | 40 | |
| 4 | 16 | 37 | |
| 5 | 13 | 43 | |
| ... | ... | ... | |

CONTROLLER AND METHOD FOR SELECTING VICTIM BLOCK FOR WEAR LEVELING OPERATION

CROSS-REFERENCE TO RELATED APPLICATION

The present application claims priority of Korean Patent Application No. 10-2020-0002903, filed on Jan. 9, 2020, which is incorporated herein by reference in its entirety.

BACKGROUND

1. Field

Various embodiments of the present invention relate to a controller for controlling a memory device.

2. Description of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since they have no moving parts, memory systems provide advantages such as excellent stability and durability, high information access speed, and low power consumption. Examples of memory systems having such advantages include universal serial bus (USB) memory devices, memory cards having various interfaces, and solid state drives (SSDs).

SUMMARY

Embodiments of the present invention are directed to a controller capable of performing a wear leveling operation efficiently, and a method for operating the controller.

In accordance with an embodiment of the present invention, a method for operating a controller for controlling a memory device including memory blocks, the method includes: determining candidate blocks based on erase counts of the memory blocks; determining a victim block among the candidate blocks based on data update counts of logical addresses associated with a plurality of pages in each of the candidate blocks; and moving data of the victim block into a destination block.

In accordance with another embodiment of the present invention, a controller for controlling a memory device including a plurality of memory blocks, the controller includes: a memory suitable for storing data update counts of data stored in the memory device for each logical address and storing an erase count for each memory block; and a flash translation layer (FTL) suitable for determining one or more candidate blocks based on erase counts of the memory blocks, determining a victim block among the candidate blocks based on the data update counts of logical addresses associated with a plurality of pages in each of the candidate blocks, and moving data of the victim block into a destination block.

In accordance with still another embodiment of the present invention, a memory system includes: a memory device including a plurality of memory blocks; and a controller, coupled to the plurality of memory blocks, suitable for: determining candidate blocks, among the plurality of memory blocks, based on an erase count of each memory block; selecting a victim block among the candidate blocks, based on a hot page count of each candidate block; and moving data of the victim block into a destination block.

BRIEF DESCRIPTION OF THE DRAWINGS

FIGS. 3 to 5 illustrate examples of an operation of a controller in accordance with an embodiment of the present invention.

DETAILED DESCRIPTION

Figure 1:
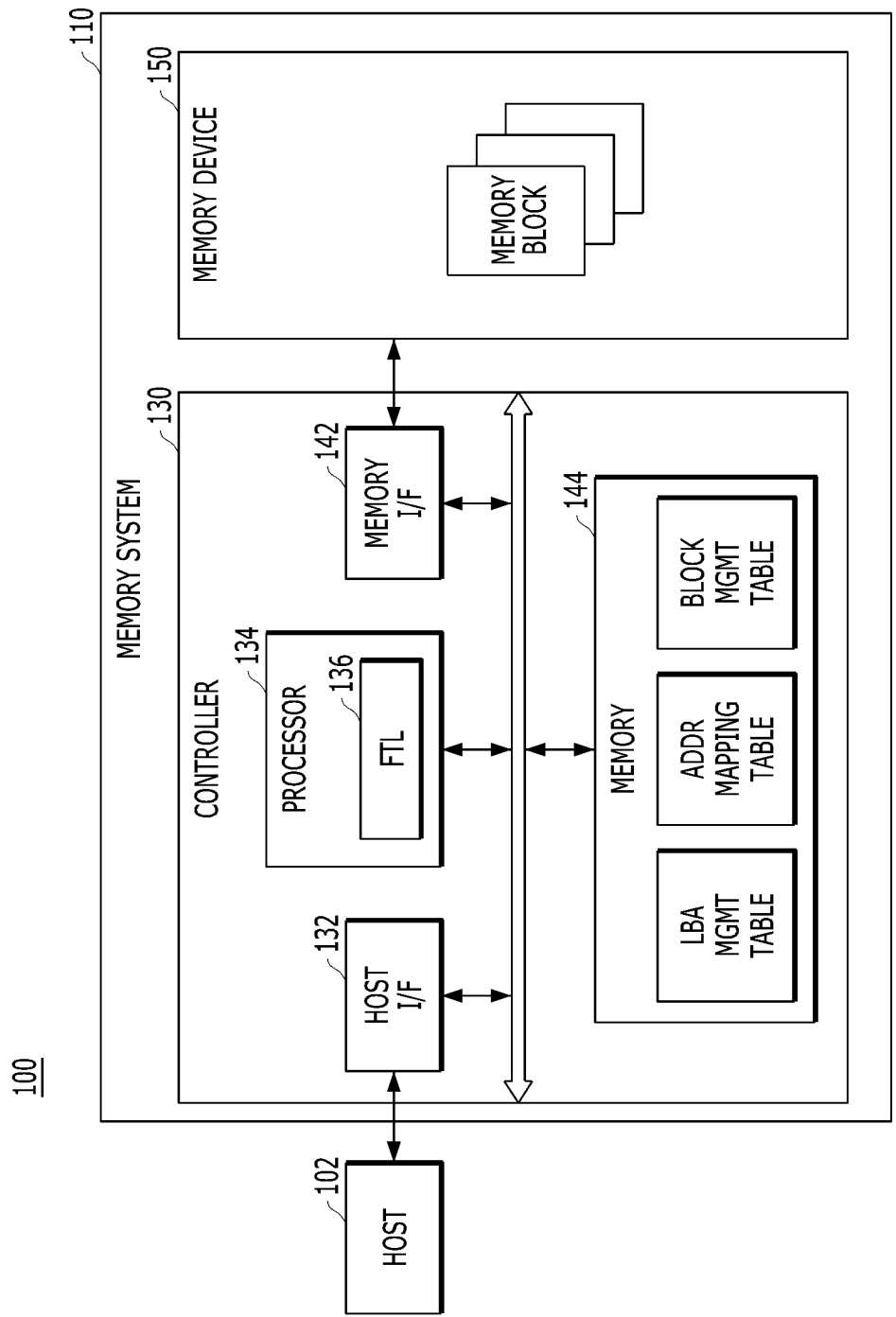
FIG. 1 is a block diagram schematically illustrating a data processing system including a controller in accordance with an embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and laptop computer, or any of various non-portable electronic devices such as a desktop computer, a game machine, a television (TV), and a projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user.

The memory system 110 may operate to store data for the host 102 in response to a request of the host 102. Non-limiting examples of the memory system 110 include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and/or micro-MMC. The SD card may include a mini-SD card and/or micro-SD card.

The memory system 110 may be embodied by any of various types of storage devices. Examples of such storage devices include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device. For example, the controller 130 and the memory device 150 may be integrated as one semiconductor device to constitute a solid state drive (SSD). When the memory system 110 is used as an SSD, the operating speed of the host 102 connected to the memory system 110 can be improved. In addition, the controller 130 and the memory device 150 may be integrated as one semiconductor device to constitute a memory card, such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD card, micro-SD card and SDHC card, or universal flash storage (UFS) device.

Non-limiting application examples of the memory system 110 include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a program operation, and provide data stored therein to the host 102 through a read operation. The memory device 150 may include a plurality of memory blocks, each of which may include a plurality of pages. Each of the pages may include a plurality of memory cells coupled to a word line. In an embodiment, the memory device 150 may be a flash memory. The flash memory may have a 3-dimensional (3D) stack structure.

A program operation of the memory device 150 may be performed on a page unit basis, and an erase operation may be performed on a memory block unit basis. In other words, the unit of the program operation and the erase operation of the memory device 150 may be different from each other. The memory device 150 does not support an overwrite function. Therefore, the controller 130 may control the memory device 150 to program the data to be updated in another page to update data stored in one page of the memory device 150, i.e., existing data, and invalidate the page in which the existing data are programmed. When the number of the invalidated pages in the memory device 150 becomes too high, the controller 130 may perform a garbage collection operation to secure a storage space. Whenever data are updated in the host 102, the physical location of the memory device 150 in which the data are stored may be changed. The controller 130 may maintain mapping information between a logical address used in the host 102 and a physical address used in the memory device 150 so that the host 102 may access the data.

The memory device 150 may have limited durability. Durability may be defined as the number of erase operations, that is, an erase count, that may be applied to a memory block before the memory device 150 loses reliability.

When program operations and erase operations are concentrated on a memory block, the lifespan of the memory device 150 may be drastically reduced. In order to prevent a sudden decrease in the lifespan of the memory device 150, a wear leveling operation may be performed to perform erase operations equally on all the memory blocks of the memory device 150. The wear leveling operation may include an operation of moving data of a victim block selected among memory blocks into a destination block. The wear leveling operation may be performed by the controller 130 described below. When the controller 130 performs a wear leveling operation, erase operations may be performed less on memory blocks that already have relatively high erase counts and thus have shorter remaining lives, while erase operations may be performed more on memory blocks that have relatively low erase count and thus have longer remaining lives, thereby leveling wear of the memory blocks to a uniform level so the remaining lives of the memory blocks are substantially the same.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, program and erase operations of the memory device 150.

The controller 130 may include a host interface (I/F) 132, a processor 134, a memory I/F 142 such as a NAND flash controller (NFC), and a memory 144, all operatively coupled via an internal bus.

The host I/F 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and/or integrated drive electronics (IDE).

The host I/F 132 may be driven through firmware referred to as a host interface layer (HIL) in order to exchange data with the host.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory I/F 142 may be driven through firmware referred to as a flash interface layer (FIL) in order to exchange data with the memory device 150.

The processor 134 may control overall operation of the memory system 110. The processor 134 may drive firmware to control overall operation of the memory system 110. The firmware may be referred to as a flash translation layer (FTL). Also, the processor 134 may be realized as a microprocessor or a central processing unit (CPU).

The controller 130 may perform a command operation corresponding to a command received from the host 102. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation onto the memory device 150 through the processor 134. For example, the background operation may include a garbage collection (GC) operation, a wear-leveling (WL) operation, a map flush operation, and/or a bad block management operation.

The controller 130 may include the FTL 136. The FTL 136 may determine a victim block for performing the wear leveling operation based on the remaining lives of the memory blocks, that is, erase counts. However, when the FTL 136 determines a victim block based only on erase count, it is difficult to achieve the purpose of the wear leveling operation.

When the data stored in a particular memory block are updated, the existing data may be invalidated. Memory blocks with many pages storing invalidated data may be preferentially erased. Memory blocks having large erase counts may protected from further erase operations by storing data that are updated less frequently.

Using only the erase count of a memory block, it may be difficult to determine whether or not the data stored in the memory block are updated frequently. When the FTL 136 determines a memory block having a small erase count as a victim block and moves the existing data of the victim block into a memory block having a large erase count, the memory block may not be sufficiently protected from erase operations.

According to an embodiment of the present invention, the FTL 136 may determine a victim block not only based on the erase count of the memory blocks but also based on the update count of the data stored in the memory blocks. An embodiment of the present invention is described below with reference to FIGS. 2 to 5.

The memory 144 may be embodied by a volatile memory. For example, the memory 144 may be embodied by static random access memory (SRAM) or dynamic random access memory (DRAM). The memory 144 may be disposed within or externally to the controller 130. FIG. 1 exemplifies the memory 144 disposed within the controller 130. In another embodiment, the memory 144 may be embodied by an external volatile memory having a memory interface transferring data between the memory 144 and the controller 130.

As described above, the memory 144 may store data required for performing a data write/read operation between the host 102 and the memory device 150 and data when the data write/read operation is performed. In order to store such data, the memory 144 may include a program memory, data memory, write buffer/cache, read buffer/cache, data buffer/cache, map buffer/cache or the like.

The memory 144 may store a logical address management (LBA MGMT) table, an address (ADDR) mapping table, and a block management (MGMT) table. The logical address management table may store the update counts of the data stored in the memory blocks by each logical address, and store the attributes of the data for each of the logical addresses determined based on the update counts. The address mapping table may store the mapping relationship between logical addresses and physical addresses. The block management table may store an erase count for each memory block of the memory device 150 and store a hot page count indicating how much frequently updated data are stored in each memory block. The logical address management table, the address mapping table, and the block management table is described in detail with reference to FIGS. 3 to 5.

Figure 2:
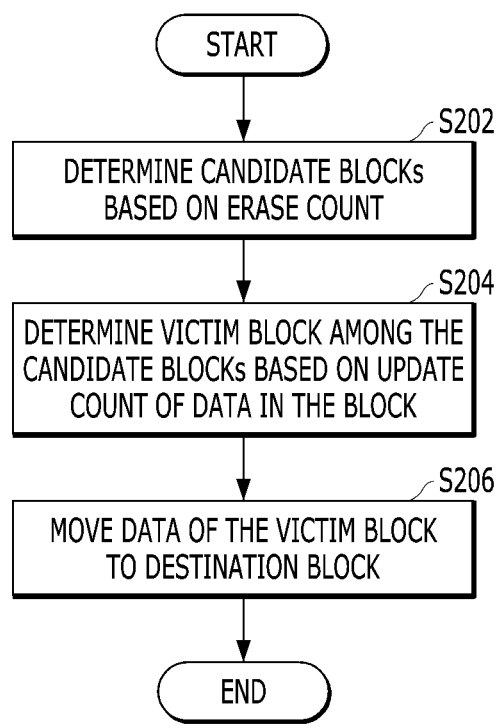
FIG. 2 is a flowchart illustrating an operation of a controller in accordance with an embodiment of the present invention.

FIG. 2 is a flowchart illustrating an operation of the controller 130 in accordance with an embodiment of the present invention.

Referring to FIG. 2, in step S202, the FTL 136 may determine candidate blocks for a victim block based on the erase counts of the memory blocks in the memory device 150.

For example, the FTL 136 may determine one or more memory blocks as candidate blocks for a victim block based on erase counts and identify the candidate blocks in descending order of erase counts.

In step S204, the FTL 136 may determine a victim block among the candidate blocks based on update counts of the data stored in the candidate blocks.

For example, the FTL 136 may determine an update count of data for each logical address and determine whether each logical address is associated with hot data or cold data based on the corresponding update count. Hot data may refer to data that are updated relatively frequently, whereas cold data may refer to data that are updated relatively infrequently. Hereinafter, a logical address associated with hot data may be referred to as a hot logical address, and a logical address associated with cold data may be referred to as a cold logical address.

In some embodiments, the FTL 136 may determine the victim block based on the number of pages associated with the hot logical addresses or the number of pages associated with the cold logical addresses for each memory block. In the following description, a page associated with a hot logical address may be referred to as a hot page, and a page associated with a cold logical address may be referred to as a cold page. For example, the FTL 136 may determine a memory block storing the least amount of hot data, that is, a block with the lowest hot page count, among the candidate blocks as a victim block.

In step S206, the FTL 136 may move the data of the victim block into a destination block.

For example, the FTL 136 may control the memory device 150 to program the data of the victim block into a block having the highest erase count.

According to an embodiment of the present invention, the FTL 136 may efficiently suppress an increase in the erase count of a memory block already having a high erase count by storing infrequently updated data in that memory block. In other words, the wear leveling performance of the FTL 136 may be improved so that the remaining lives of the memory blocks with large erase counts and the memory blocks with low erase counts may be equalized more quickly. In this way, the performance and lifespan of the memory system 110 may be improved further.

FIG. 3 illustrates an operation of the controller 130 in accordance with an embodiment of the present invention. To be specific, FIG. 3 is a diagram for describing a method in which the FTL 136 distinguishes each logical address of the memory device 150 as a hot logical address or a cold logical address based on a logical address management table.

Referring to FIG. 3, the memory 144 may include or store a logical address management table, which stores a data update count UPDATE and a flag FLAG for each logical address LBA. The flag may indicate whether each logical address is a hot logical address or a cold logical address. In the example of FIG. 3, a flag '0' indicates that the logical address is a cold logical address, and a flag '1' indicates that the logical address is a hot logical address. However, this bit convention may be reversed.

The data update count and flag in the block management table may be changed according to a command received from the host 102. The first to fourth tables TABLE1 to TABLE4 of FIG. 3 may represent that the data update counts and flags of the logical address management table change over time.

The FTL 136 may count each time that data of each logical address is updated based on a write command and associated logical address received from the host 102 and increment the corresponding update count. When data corresponding to a logical address are updated in the host 102, the host 102 may provide a command to write the updated data at the logical address to the memory system 110. In the example of FIG. 3, the FTL 136 may increase the data update count of the logical address by '1' when a write command associated with a logical address is received from the host 102 (see TABLE2).

In an embodiment of the present invention, the FTL 136 may periodically decrease the data update count of all the logical addresses by a set amount. In the example of FIG. 3, the FTL 136 may decrease the data update count of all the logical addresses by '1' whenever the number of times that the host 102 receives a command, i.e., a command reception count, becomes a multiple of '5' (e.g., 10) (see TABLE3). The command reception count may include a write command reception count and a read command reception count. When the FTL 136 periodically decreases the data update count of all the logical addresses, the influence of the past data update counts on determining a hot logical address or a cold logical address for each logical address may be reduced.

In an embodiment of the present invention, the FTL 136 may determine the logical address as a cold logical address or a hot logical address based on the data update count of the logical address. In the example of FIG. 3, when the data update count of a cold logical address increases to approximately '10' or more, the FTL 136 may change the logical address to a hot logical address and display a flag '1' (see TABLE2). When the data update count of the hot logical address decreases to approximately '8' or less, the FTL 136 may change the logical address to a cold logical address and display a flag '0' (see TABLE4).

The first table TABLE1 may represent a logical address management table at a first time. The data update counts of the first to fourth logical addresses at the first time may be '2', '9', '3', and '9', respectively. The flags of the first to fourth logical addresses may be '0', '0', '0', and '0', respectively, which indicate that the first to fourth logical addresses are all cold logical addresses.

The second table TABLE2 may represent a logical address management table at a second time after the first time. FIG. 3 illustrates a state in which one write command for the second logical address is received between the first and second times, and two read commands are further received. At the second time, the data update count of the second logical address may be '10'. Since the data update count of the second logical address, which used to be a cold logical address, is greater than or equal to '10', the FTL 136 may change the second logical address to a hot logical address. The second table TABLE2 illustrates a state in which a flag associated with a second logical address is changed to '1'.

The third table TABLE3 may represent a logical address management table at a third moment after the second time. FIG. 3 illustrates a state in which two write commands for a fourth logical address are received between the second and third times. The FTL 136 may increase the data update count of the fourth logical address by '2'. Since the number of commands received from the host 102 is five at the third time, the FTL 136 may decrease the data update counts of the first to fourth logical addresses by '1'. At the third time, the data update counts of the first to fourth logical addresses may be changed to '1', '9', '2', and '10', respectively. Since the data update count of the fourth logical address, which was a cold logical address, becomes greater than or equal to '10', the FTL 136 may change the flag associated with the fourth logical address to '1'.

The fourth table TABLE4 indicates a logical address management table at a fourth time after the third time. FIG. 3 illustrates a state in which five read commands are received between the third and fourth times. Since the number of commands received from the host 102 is five at the fourth time, the FTL 136 may decrease the data update counts of the first to fourth logical addresses by '1'. At the fourth time, the data update counts of the first to fourth logical addresses may be changed to '0', '8', '1', and '9', respectively. The FTL 136 may change the flag associated with the second logical address to '0' since the data update count of the second logical address, which was a hot logical address, becomes less than or equal to.

Figure 4:
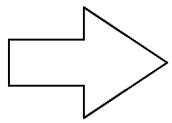

FIG. 4 illustrates an operation of the controller 130 in accordance with an embodiment of the present invention. To be specific, FIG. 4 illustrates a method of how the FTL 136 performs a hot page count operation for each memory block based on a logical address management table and an address mapping table.

Referring to FIG. 4, the memory 144 stores a logical address management table and an address mapping table.

The left table of FIG. 4 shows a part of the logical address management table. To be specific, the logical address management table shown in FIG. 4 represents a flag FLAG for each logical address LBA; the data update count is omitted.

As shown in FIG. 3, the flag may represent a hot logical address with '1', and represent a cold logical address with '0'.

The right table of FIG. 4 may show an address mapping table. To be specific, the address mapping table shown in FIG. 4 may represent logical addresses respectively associated with the first to fifth pages PAGE1-PAGE5 of a first memory block BLOCK1.

A memory block may include pages, each of which may be associated with a logical address. In the example of FIG. 4, a first page PAGE1 of the first memory block BLOCK1 may store data corresponding to a first logical address LBA1. The FTL 136 may determine how much cold data are stored in the memory block based on how many hot logical addresses or cold logical addresses are associated with the pages in the memory block. In the following description, a page associated with a hot logical address may be referred to as a hot page, and a page associated with a cold logical address may be referred to as a cold page.

The FTL 136 may refer to the logical address management table and the address mapping table to count how many hot pages a memory block includes. Referring to the address mapping table of FIG. 4, the first to fifth pages PAGE1-PAGE5 of the first memory block BLOCK1 may be associated with first, second, seventh, eighth, and ninth logical addresses, respectively. Referring to the logical address management table of FIG. 4, the flags of the first, second, seventh, eighth, and ninth logical addresses may be '0', '0', '1', '0', and '1', respectively. Thus, the first, second and fourth pages of the first memory block may be cold pages associated with cold logical addresses, and third and fifth pages may be hot logical pages associated with hot logical addresses. The FTL 136 may determine the hot page count of the first memory block BLOCK1 as '2'.

FIG. 5 illustrates an operation of the controller 130 in accordance with an embodiment of the present invention. To be specific, FIG. 5 is a diagram for describing how the FTL 136 determines candidate blocks by referring to a block management table and determines a victim block among the candidate blocks.

Referring to FIG. 5, the memory 144 includes or stores a block management table. FIG. 5 exemplarily illustrates a block management table including an erase count and a hot page count for each memory block. For example, the first memory block may have an erase count of 15 and may include 50 current hot pages at present.

As described with reference to FIG. 2, the FTL 136 may determine one or more memory blocks as candidate blocks in descending order of the erase counts by referring to the block management table. In the example of FIG. 5, the FTL 136 may determine the second and third memory blocks, which are the blocks having the lowest erase counts, as candidate blocks. Dashed lines shown in FIG. 5 may represent candidate blocks.

The FTL 136 may select a memory block that stores the most cold data among the candidate blocks as a victim block by referring to the block management table. In the example of FIG. 5, the FTL 136 may determine a memory block having the lowest hot page count, among the candidate blocks, as the memory block that stores the most cold data. In the example of FIG. 5, the second memory block has the lowest hot page count; thus, the FTL 136 may determine the second memory block among the second and third memory blocks as a victim block.

The FTL 136 may move the data of the victim block into a destination block. The FTL 136 may determine a memory block having the lowest erase count as a destination block by referring to the block management table.

The concept and spirit of the present invention are not limited to the examples described with reference to FIGS. 3 to 5. For example, the logical address management table may indicate a cold logical address with a flag '1' and a hot logical address with a flag '0'. The block management table may store a cold page count for each memory block instead of storing a hot page count for each memory block.

According to an embodiment of the present invention, the FTL 136 may control the memory device 150 to store the data of a memory block having a large erase count and storing a large amount of cold data in a memory block having a large erase count. The FTL 136 may swap the data of a memory block having a high erase count with the data of a memory block having a low erase count, while reducing the amount of data stored in a memory block having a high erase count. The FTL 136 may be able to equalize the erase counts of the memory blocks more quickly by preventing an erase operation from being performed on a memory block having a large erase count.

Embodiments of the present invention provide a controller that may improve the performance and lifespan of a memory system by efficiently performing a wear leveling operation, and a method for operating the controller.

While the present invention has been illustrated and described with respect to specific embodiments, it will be apparent to those skilled in the art that various changes and modifications may be made without departing from the spirit and scope of the invention as defined in the following claims. Thus, the present invention encompasses all such changes and modifications that fall within the scope of the claims.

What is claimed is:

1. A method for operating a controller for controlling a memory device including memory blocks, the method comprising:
   determining candidate blocks based on erase counts of the memory blocks;
   determining a victim block among the candidate blocks based on data update counts of logical addresses associated with a plurality of pages in each of the candidate blocks; and
   moving data of the victim block into a destination block,
   wherein the determining of the victim block includes:
      determining whether each of the logical addresses is a hot logical address or a cold logical address based on a data update count for each logical address; and
      determining the victim block among the candidate blocks based on the number of hot logical addresses or cold logical addresses among the logical addresses associated with the plurality of pages.

2. The method of claim 1, wherein the determining of the candidate blocks based on the erase counts of the memory blocks includes:
   determining memory blocks as the candidate blocks in descending order of the erase counts among the memory blocks.

3. The method of claim 2, wherein the determining of memory blocks as the candidate blocks in descending order of the erase counts among the memory blocks includes:
   determining memory blocks having lowest erase counts as the candidate blocks.

4. The method of claim 2, further comprising:
   determining a block having a highest erase count among the memory blocks as the destination block.

5. The method of claim 1, wherein the determining of the victim block among the candidate blocks based on the number of the hot logical addresses or the cold logical addresses among the logical addresses associated with the plurality of pages includes:
   determining a candidate block having a highest number of cold logical addresses as the victim block.

6. The method of claim 1, wherein the determining of the victim block among the candidate blocks based on the number of the hot logical addresses or the cold logical addresses among the logical addresses associated with the plurality of pages includes:
   determining a candidate block having a lowest number of hot logical addresses as the victim block.

7. The method of claim 1, further comprising:
   incrementing the data update count of a logical address when a write command associated with the logical address is received from a host.

8. The method of claim 7, further comprising:
   decrementing the data update counts of all logical addresses associated with data stored in the memory device whenever the number of commands received from the host reaches a set number.

9. The method of claim 7, wherein the determining of whether each of the logical addresses is a hot logical address or a cold logical address based on the data update count for each logical address includes:
   when the data update count of a cold logical address is greater than or equal to a first threshold value, changing the cold logical address to a hot logical address; and
   when the data update count of a hot logical address is greater than or equal to a second threshold value, changing the hot logical address to a cold logical address.

10. A controller for controlling a memory device including a plurality of memory blocks, the controller comprising:
   a memory suitable for storing data update counts of data stored in the memory device for each logical address and storing an erase count for each memory block; and
   a flash translation layer (FTL) suitable for determining candidate blocks based on erase counts of the memory blocks, determining a victim block among the candidate blocks based on the data update counts of logical addresses associated with a plurality of pages in each of the candidate blocks, and moving data of the victim block into a destination block,
   wherein the FTL:
      determines whether each of the logical addresses is a hot logical address or a cold logical address based on a data update count for each logical address; and
      determines the victim block among the candidate blocks based on the number of hot logical addresses or cold logical addresses among the logical addresses associated with the plurality of pages.

11. The controller of claim 10, wherein the FTL determines memory blocks as the candidate blocks in descending order of the erase counts decrease among the memory blocks.

12. The controller of claim 11, wherein the FTL determines memory blocks having a lowest erase counts as the candidate blocks.

13. The controller of claim 10, wherein the FTL determines a candidate block having a highest number of cold logical addresses as the victim block.

14. The controller of claim 10, wherein the FTL determines a candidate block having a lowest number of hot logical addresses as the victim block.

15. The controller of claim 10, wherein the FTL increments the data update count of a logical address when a write command associated with the logical address is received from a host.

16. The controller of claim 15, wherein the FTL decrements the data update counts of all the logical addresses associated with data stored in the memory device whenever the number of commands received from the host reaches a set number.

17. The controller of claim 15, wherein
   when the data update count of a cold logical address is greater than or equal to a first threshold value, the FTL changes the cold logical address to a hot logical address; and
   when the data update count of a hot logical address is greater than or equal to a second threshold value, the FTL changes the hot logical address to a cold logical address.

18. A memory system comprising:
   a memory device including a plurality of memory blocks; and
   a controller, coupled to the plurality of memory blocks, suitable for:
   determining candidate blocks, among the plurality of memory blocks, based on an erase count of each memory block;
   selecting a victim block among the candidate blocks, based on a hot page count of each candidate block; and
   moving data of the victim block into a destination block,
   wherein the selecting of the victim block includes:
      determining whether each of the logical addresses is a hot logical address or a cold logical address based on a data update count for each logical address; and
      selecting the victim block among the candidate blocks based on the number of hot logical addresses or cold logical addresses among the logical addresses associated with the plurality of pages.

* * * * *